United States Patent
Ueta

(10) Patent No.: US 12,245,459 B2
(45) Date of Patent: Mar. 4, 2025

(54) LIGHT-EMITTING DEVICE INCLUDING A LIGHT-EMITTING DIODE AND A PROTECTIVE DIODE AND DISPLAY DEVICE

(71) Applicant: Sharp Kabushiki Kaisha, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 473 days.

(21) Appl. No.: 17/630,543

(22) PCT Filed: Aug. 23, 2019

(86) PCT No.: PCT/JP2019/033093
§ 371 (c)(1),
(2) Date: Jan. 27, 2022

(87) PCT Pub. No.: WO2021/038635
PCT Pub. Date: Mar. 4, 2021

(65) Prior Publication Data
US 2022/0246693 A1    Aug. 4, 2022

(51) Int. Cl.
H10K 59/00     (2023.01)
H10K 50/15     (2023.01)
H10K 59/122    (2023.01)
H10K 71/00     (2023.01)

(52) U.S. Cl.
CPC ........... *H10K 59/00* (2023.02); *H10K 50/156* (2023.02); *H10K 71/00* (2023.02); *H10K 59/122* (2023.02)

(58) Field of Classification Search
CPC ................ H10K 59/00; H10K 59/122; H10K 59/80522; H10K 50/156; G09F 9/30; H05B 33/12
See application file for complete search history.

(56) References Cited

U.S. PATENT DOCUMENTS

| | | | |
|---|---|---|---|
| 7,932,111 B2* | 4/2011 | Edmond | H01L 33/007 438/33 |
| 9,590,008 B2* | 3/2017 | Moosburger | H01L 27/15 |
| 11,126,058 B1* | 9/2021 | Ogiso | G02F 1/01708 |
| 2007/0166843 A1* | 7/2007 | Yamazaki | H10K 59/12 438/4 |
| 2007/0258500 A1* | 11/2007 | Albrecht | H01L 27/15 257/E27.12 |

(Continued)

FOREIGN PATENT DOCUMENTS

| | | | |
|---|---|---|---|
| JP | 2001-093662 A | 4/2001 | |
| JP | 2009-271309 A | 11/2009 | |

(Continued)

OTHER PUBLICATIONS

Official Communication issued in International Patent Application No. PCT/JP2019/033093, mailed on Oct. 15, 2019.

*Primary Examiner* — Khiem D Nguyen
(74) *Attorney, Agent, or Firm* — Keating & Bennett, LLP

(57) ABSTRACT

This light-emitting device includes: a light-emitting diode including a light-emitting layer of quantum dots or an organic light-emitting material; and a protection diode located adjacent to, and connected in parallel with, the light-emitting diode, wherein the protection diode is operated in reverse bias to protect the light-emitting diode.

12 Claims, 15 Drawing Sheets

(56) References Cited

U.S. PATENT DOCUMENTS

2012/0018763 A1* 1/2012 Engl ................. H01L 33/382
                                                    438/42
2012/0319126 A1   12/2012 Butendeich et al.
2015/0373243 A1* 12/2015 Toda ................ H01L 27/14685
                                                    348/294

FOREIGN PATENT DOCUMENTS

JP      2017-224833 A    12/2017
JP      2018-046258 A     3/2018

* cited by examiner

LIGHT-EMITTING DEVICE INCLUDING A LIGHT-EMITTING DIODE AND A PROTECTIVE DIODE AND DISPLAY DEVICE

TECHNICAL FIELD

The disclosure relates to light-emitting devices, display devices including light-emitting devices, and methods of manufacturing light-emitting devices.

BACKGROUND ART

Patent Literature 1 discloses the following structure. In an inorganic semiconductor LED including a stack of epitaxial layers, protection diodes are provided in regions where there occur threading dislocations. Electrically, this structure delivers a circuit that is equivalent to a plurality of protection diodes being connected with the same polarity in parallel with a known LED, to take advantage of the forward characteristics of the protection diodes for protection against excess voltage.

CITATION LIST

Patent Literature

Patent Literature 1: Japanese Unexamined Patent Application Publication, Tokukai, No. 2017-224833 (Publication Date: Dec. 21, 2017)

SUMMARY

Technical Problem

The structure disclosed in Patent Literature 1 have the following problems. First, the structure is only available in semiconductor crystal-based inorganic LEDs since the structure exploits the threading dislocation region in epitaxially grown crystals in such inorganic LEDs. In other words, the structure disclosed in Patent Literature 1 is difficult to apply to protection diodes that protect a light-emitting diode including a light-emitting layer of quantum dots or an organic light-emitting material.

Secondly, because the protection diode has the same polarity as the LED, the threshold voltage in the forward I-V characteristics serves as the protection voltage. In principle, the protection diode is conducting under a voltage that does not differ much from the operating voltage of the LED to be protected. When the entire device is considered, a leak current is continuously flowing, which means that there is generated an invalid current that does not contribute to emission of light.

The disclosure, conceived to address these problems, has an object to discharge the excess electric charge accumulated in a light-emitting diode including a light-emitting layer of quantum dots or an organic light-emitting material by means of a protection diode, to protect the light-emitting diode.

Solution to Problem

To address the problems, the disclosure, in an aspect thereof, is directed to a light-emitting device including: a light-emitting diode including a light-emitting layer of quantum dots or an organic light-emitting material; and a protection diode located adjacent to, and connected in parallel with, the light-emitting diode, wherein the protection diode is operated in reverse bias to protect the light-emitting diode.

To address the problems, the disclosure, in an aspect thereof, is directed to a display device including: a plurality of light-emitting devices; and a second cathode electrode that is common to the plurality of light-emitting devices, wherein each of the plurality of light-emitting devices includes an insular, second anode electrode that is common to the light-emitting diode and the protection diode therein, the light-emitting diode includes: a light-emitting layer between the second anode electrode and the second cathode electrode; and a first hole transport layer and a second hole transport layer in this order between the second anode electrode and the light-emitting layer, the protection diode includes a n-type semiconductor layer and a p-type semiconductor layer in this order between the second anode electrode and the second cathode electrode, the first hole transport layer is made of a same material, and located in a same layer, as the n-type semiconductor layer, and the second hole transport layer is made of a same material, and located in a same layer, as the p-type semiconductor layer.

To address the problems, the disclosure, in an aspect thereof, is directed to a display device including: a plurality of light-emitting devices; and a third anode electrode that is common to the plurality of light-emitting devices, wherein each of the plurality of light-emitting devices includes an insular, third cathode electrode that is common to the light-emitting diode and the protection diode therein, the light-emitting diode includes: a light-emitting layer between the third cathode electrode and the third anode electrode; and a first electron transport layer and a second electron transport layer in this order between the third cathode electrode and the light-emitting layer, the protection diode includes a p-type semiconductor layer and a n-type semiconductor layer in this order between the third cathode electrode and the third anode electrode, the first electron transport layer is made of a same material, and located in a same layer, as the p-type semiconductor layer, and the second electron transport layer is made of a same material, and located in a same layer, as the n-type semiconductor layer.

To address the problems, the disclosure, in an aspect thereof, is directed to a method of manufacturing a light-emitting device, the method including: providing a n-type semiconductor layer and a p-type semiconductor layer across two regions separated by a partition wall; preparing a light-emitting diode including a hole transport layer including the n-type semiconductor layer and the p-type semiconductor layer in one of the regions; and preparing a protection diode including the n-type semiconductor layer and the p-type semiconductor layer in the other region, the protection diode being connected in parallel with the light-emitting diode and operated in reverse bias to protect the light-emitting diode.

Advantageous Effects of Invention

The disclosure, in an aspect thereof, causes a large electric current to flow through the protection diode when the protection diode is placed under an applied voltage that is greater than or equal to the reverse breakdown voltage thereof. This particular mechanism enables the light-emitting diode to discharge the excess electric charge accumulated therein through the protection diode, thereby protecting the light-emitting diode.

DESCRIPTION OF EMBODIMENTS

Embodiment 1

Example 1

Throughout the present specification, the Roman numerals denoting groups of elements follow the defunct CAS numbering system, and the Arabic numerals denoting groups of elements follow the current IUPAC numbering system.

Figure 1:
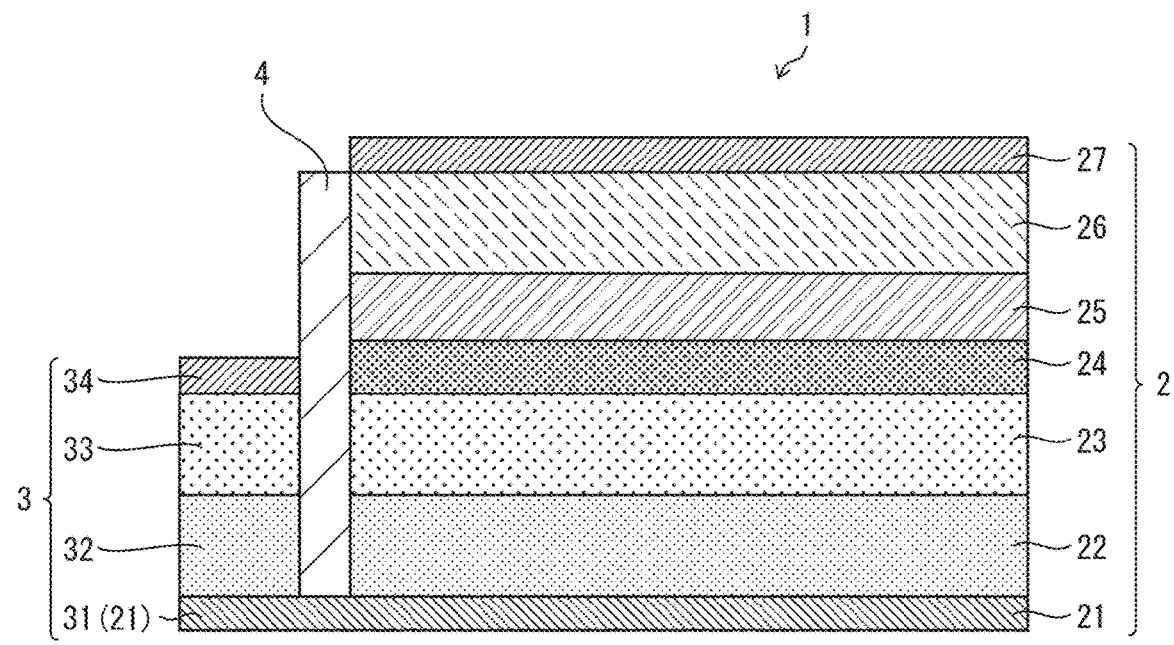
FIG. 1 is a schematic cross-sectional view of a light-emitting device in accordance with Embodiment 1 of the disclosure.

FIG. 1 is a schematic cross-sectional view of a light-emitting device 1 in accordance with the present embodiment.

Referring to FIG. 1, the light-emitting device 1 includes a light-emitting diode 2, a protection diode 3, and a partition wall 4 separating the light-emitting diode 2 and the protection diode 3. The light-emitting device 1 is typically disposed on an array substrate (not shown) and electrically connected to a TFT (thin film transistor) formed on the array substrate.

Light-Emitting Diode

The light-emitting diode 2 includes a light-emitting layer 25 that may contain quantum dots (semiconductor nanoparticles) or an organic light-emitting material in the present example of the invention. FIG. 1 represents an example where the light-emitting layer 25 contains QDs (quantum dots).

The quantum dot (QD) has a "core/shell structure" (not shown) including a core and a shell surrounding the core.

The light-emitting diode 2 has a structure including a stack of layers. Each layer may be formed by sputtering a material doped with a desirable impurity or by applying a colloidal solution of such a material prepared in nanoparticle form.

Specifically, as shown in FIG. 1, the light-emitting diode 2 includes an anode electrode (positive electrode) 21, a first hole transport layer 22, a second hole transport layer 23, a third hole transport layer 24, the light-emitting layer 25, an electron transport layer 26, and a cathode electrode (negative electrode) 27 arranged in this order when viewed from the bottom layer toward the top layer in FIG. 1.

The anode electrode 21 and the cathode electrode 27 contain a conductive material and are electrically connected to a first hole transport layer 22 and the electron transport layer 26 respectively.

The first hole transport layer 22, the second hole transport layer 23, and the third hole transport layer 24 transport holes from the anode electrode 21 to the light-emitting layer 25. These first, second, and third hole transport layers may be collectively referred to as the hole transport layers when there is no need to distinguish between the layers. Each hole transport layer is, for example, an inorganic semiconductor layer.

The hole transport layers of the light-emitting diode 2 are a n$^+$ semiconductor layer (first hole transport layer 22), a p$^+$ semiconductor layer (second hole transport layer 23), and a p-type semiconductor layer (third hole transport layer 24) arranged in this order when viewed from the anode electrode 21 as shown in FIG. 1 in the present example of the invention.

The n$^+$ semiconductor layer 22 contains either a Group 13 element and the same Group II-VI semiconductor as the shell of the quantum dot or a Group 13 element and a Group II-VI semiconductor that contains a Group II element that, in the periodic table, is placed in a period below the Group II element contained in the shell.

The p$^+$ semiconductor layer 23 contains either a Group 15 element and the same Group II-VI semiconductor as the shell of the quantum dot or a Group 15 element and a Group II-VI semiconductor that contains a Group II element that, in the periodic table, is placed in a period below the Group II element contained in the shell.

This Group 15 element has a concentration that is equal to, or of the same order as, the concentration of the Group 13 element in the n$^+$ semiconductor layer 22.

The p-type semiconductor layer 24 contains either a Group 15 element and the same Group II-VI semiconductor as the shell of the quantum dot or a Group 15 element and a Group II-VI semiconductor that contains a Group II element that, in the periodic table, is placed in a period below the Group II element contained in the shell. The p-type semiconductor layer 24 has a lower Group 15 element concentration than the p$^+$ semiconductor layer 23.

The electron transport layer 26 transports electrons from the cathode electrode 27 to the light-emitting layer 25. The electron transport layer 26 may have a function of disrupting the transport of holes.

Protection Diode

The protection diode 3 enables the light-emitting diode 2 to discharge the excess electric charge accumulated therein to protect the light-emitting diode 2 in the present example of the invention. The protection diode 3 has reverse characteristics. The term, "reverse characteristics," in this context indicates that the protection diode 3 has such a polarity that it allows a large electric current flow therethrough at low voltage when the p-n junction thereof undergoes a reverse breakdown and returns to zero flow condition when the voltage decreases.

The protection diode 3 has a structure including a stack of layers. Specifically, as shown in FIG. 1, the protection diode 3 includes an anode electrode 31, a first hole transport layer 32, a second hole transport layer 33, and a cathode electrode 34 arranged in this order when viewed from the bottom layer toward the top layer in FIG. 1.

The anode electrode 31 of the protection diode 3 is formed integral to the anode electrode 21 of the light-emitting diode 2 as shown in FIG. 1 in the present example of the invention. The first hole transport layer 32 and the second hole transport layer 33 of the protection diode 3 are made of the same materials as the first hole transport layer 22 and the second hole transport layer 23 of the light-emitting diode 2 respectively.

Specifically, similarly to the n$^+$ semiconductor layer 22 of the light-emitting diode 2, the n$^+$ semiconductor layer 32 of the protection diode 3 contains either a Group 13 element and the same Group II-VI semiconductor as the shell of the quantum dot or a Group 13 element and a Group II-VI semiconductor that contains a Group II element that, in the periodic table, is placed in a period below the Group II element contained in the shell.

The p$^+$ semiconductor layer 33 contains either a Group 15 element and the same Group II-VI semiconductor as the shell of the quantum dot or a Group 15 element and a Group II-VI semiconductor that contains a Group II element that, in the periodic table, is placed in a period below the Group II element contained in the shell.

This Group 15 element has a concentration that is equal to, or of the same order as, the concentration of the Group 13 element in the n$^+$ semiconductor layer 32.

The cathode electrode 34 of the protection diode 3 and the cathode electrode 27 of the light-emitting diode 2 are separately formed as shown in FIG. 1.

In other words, the first hole transport layer 22 and the second hole transport layer 23 of the light-emitting diode 2 are only separated by the partition wall 4, which is in contact with the anode electrode 31 (21), and provided with electrodes, one on the top and the other on the bottom, to form the protection diode 3 in the present example of the invention.

This structure in accordance with the present example of the invention only requires an additional separation step when compared to the process of manufacturing the light-emitting diode 2, to manufacture the protection diode 3. The protection diode 3 is electrically separated from the light-emitting diode 2, but located adjacent to, and connected in parallel with, the light-emitting diode 2, which obviates the need for post-processing such as wire bonding. A specific manufacturing method will be described later in detail.

The structure can achieve efficient discharging of electric charge because the electrical interface between the same material as at least a portion of the hole transport layer and the electrodes has a low contact resistance. The structure also requires a fewer steps to manufacture the light-emitting device, hence allowing for low cost manufacturing of the light-emitting device, because the steps of manufacturing the light-emitting diode and the steps of manufacturing the protection diode can be performed in parallel.

Figure 2:
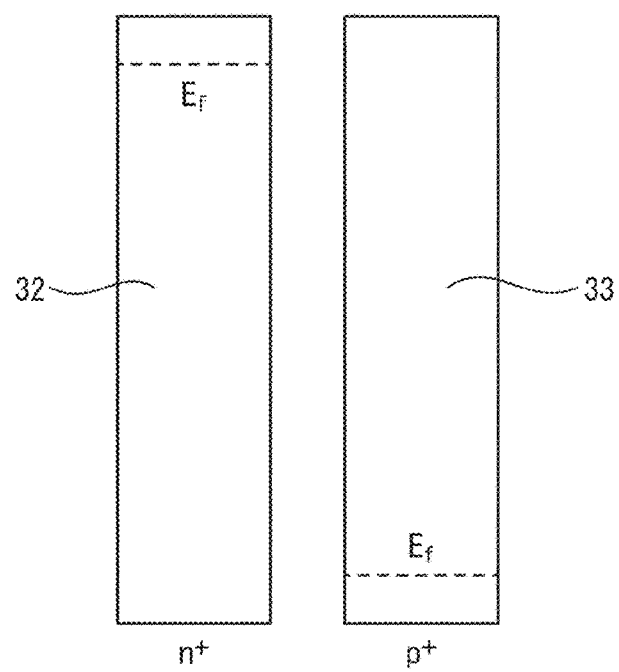
FIG. 2 is a band structure diagram for a protection diode in the light-emitting device shown in FIG. 1.

FIG. 2 is a band structure diagram for the protection diode 3 in the light-emitting device 1. Dotted lines $E_f$ in FIG. 2 indicate the Fermi levels of the first hole transport layer 32 and the second hole transport layer 33 (two simple substances) of the protection diode 3.

FIGS. 3 to 6 are layered structure and band structure diagrams for the light-emitting diode 2 in the light-emitting device 1.

Figure 3:
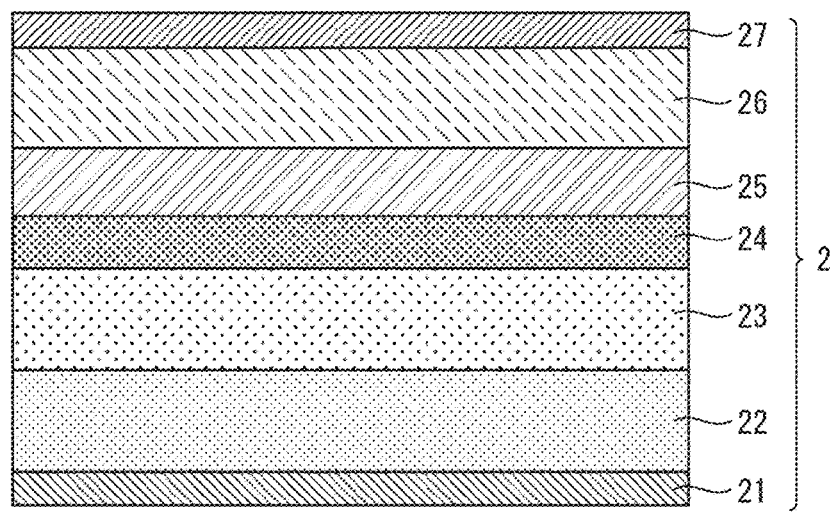
FIG. 3 is a layered structure diagram for a light-emitting diode in the light-emitting device shown in FIG. 1.

Specifically, FIG. 3 is a layered structure diagram for the light-emitting diode 2 in the light-emitting device 1. The light-emitting diode 2 has a layered structure that is, as shown in FIG. 3, equivalent to the light-emitting device 1 shown in FIG. 1 minus the protection diode 3 and the partition wall 4. Detailed description thereof is therefore omitted.

Figure 4:
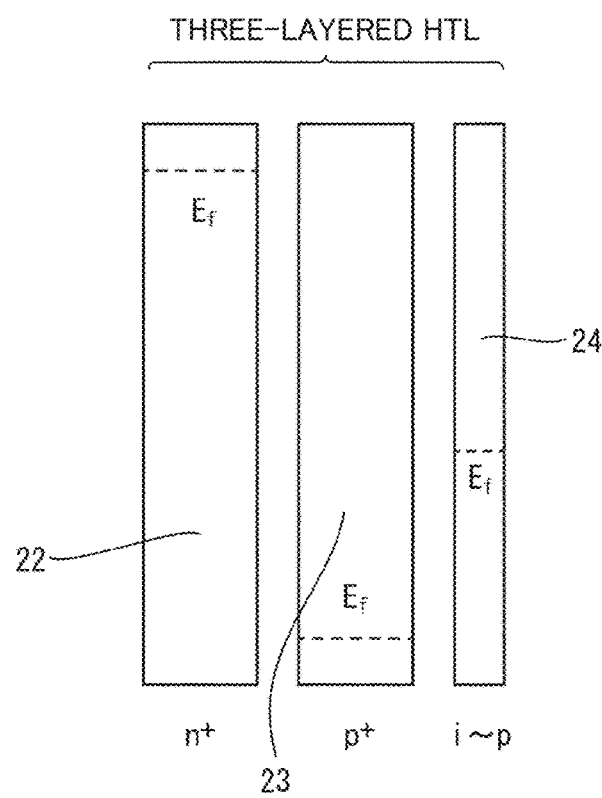
FIG. 4 is a band diagram for a hole transport layer that has an isolated three-layered structure shown in FIG. 3.

FIG. 4 is a band diagram for a hole transport layer that has an isolated three-layered structure shown in FIG. 3. Dotted lines $E_f$ in FIG. 4 indicate the Fermi levels of the first hole transport layer 22, the second hole transport layer 23, and the third hole transport layer 24 (three simple substances) of the protection diode 3.

Figure 5:
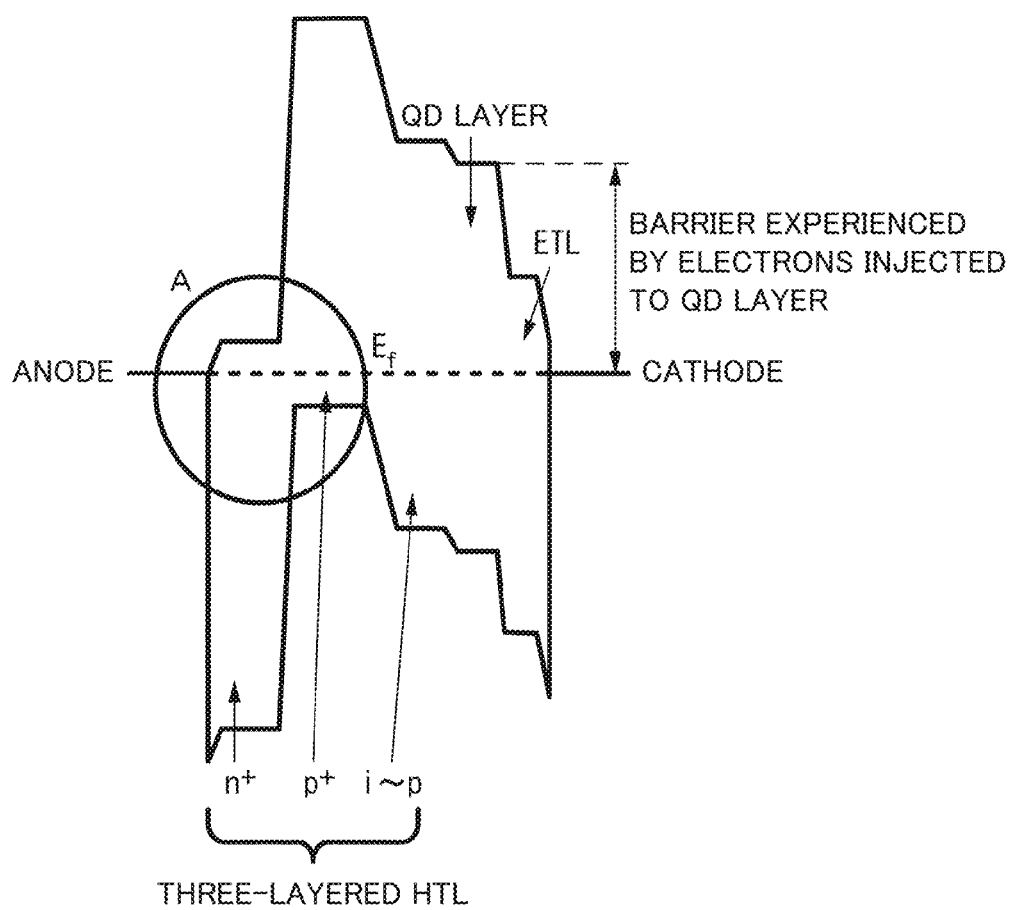
FIG. 5 is a band diagram for a light-emitting device in the absence of electric field.
Figure 6:
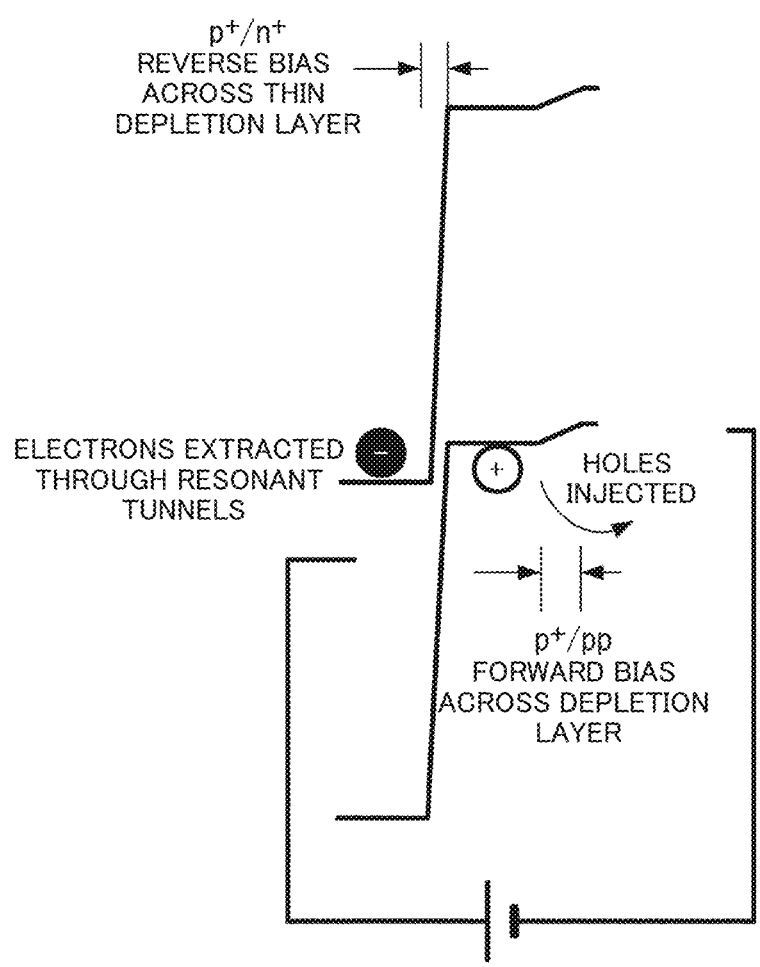
FIG. 6 is a band diagram for region A shown in FIG. 5 when the light-emitting device is being driven.

FIG. 5 is a band diagram for the light-emitting device 1 in the absence of electric field. FIG. 6 is a band diagram for region A shown in FIG. 5 when the light-emitting device 1 is being driven. The electron transport layer 26 has a known structure and is therefore omitted in FIG. 6.

Figure 7:
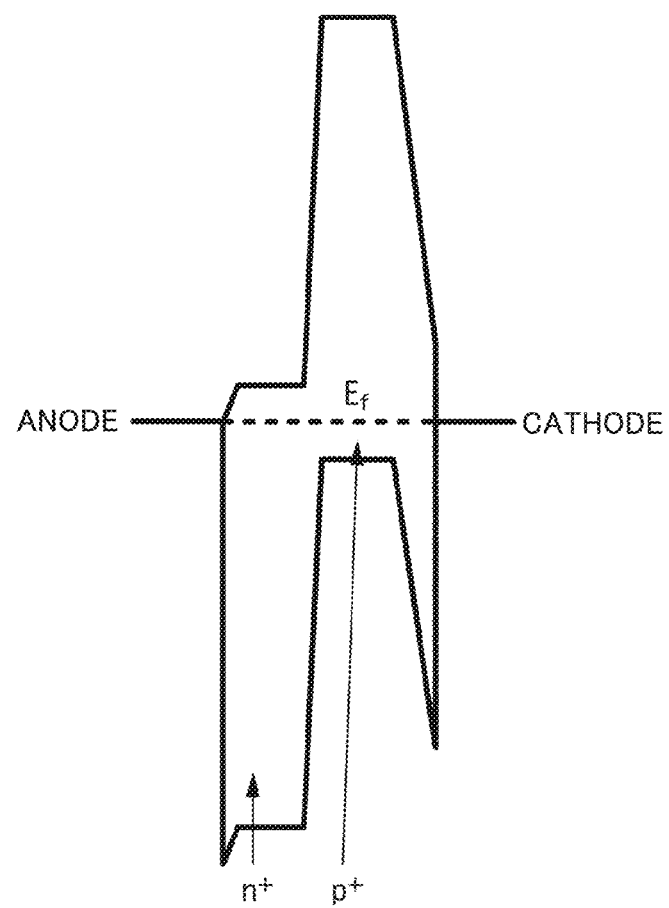
FIG. 7 is a band diagram for the protection diode in the light-emitting device shown in FIG. 1 in the absence of electric field.

FIG. 7 is a band diagram for the protection diode 3 in the light-emitting device 1 in the absence of electric field. FIG. 7 shows that the cathode electrode 34 of the protection diode 3 has a lower work function than the protection diode 3 because the cathode electrode 34 has the same structure as the cathode electrode 27 of the light-emitting diode 2, and the junction between the cathode electrode 34 and the p$^+$ semiconductor layer 33 is a Schottky junction with a high barrier.

When this band structure is placed under forward bias, an additional voltage is needed that flattens the Schottky barrier between the p$^+$ semiconductor layer 33 and the cathode electrode 34, so that the junction between the n$^+$ semiconductor layer 32 and the p$^+$ semiconductor layer 33 can undergo a reverse breakdown.

This voltage is equal to the difference between the work function of the cathode electrode 34 and the Fermi level $E_f$ of the p$^+$ semiconductor layer 33. The operating voltage of the protection diode 3 is therefore higher than the drive voltage of the light-emitting diode 2.

The present example of the invention causes a large electric current to flow through the protection diode 3 when the protection diode 3 is placed under an applied voltage that is greater than or equal to the reverse breakdown voltage thereof. This particular mechanism enables the light-emitting diode 2 to discharge the excess electric charge accumulated therein through the protection diode 3, thereby protecting the light-emitting diode 2.

Example 2

Process of Manufacturing Light-Emitting Device

FIGS. 8 to 15 are diagrams representing a process of manufacturing a light-emitting device in accordance with the present example of the invention. The light-emitting device in accordance with the present example of the invention has the same structure as the light-emitting device 1 in accordance with Example 1, except that the light-emitting diode 2 and the protection diode 3 share a single cathode electrode in the former.

The following will describe in detail a process of manufacturing the light-emitting device in accordance with the present example of the invention.

Figure 8:
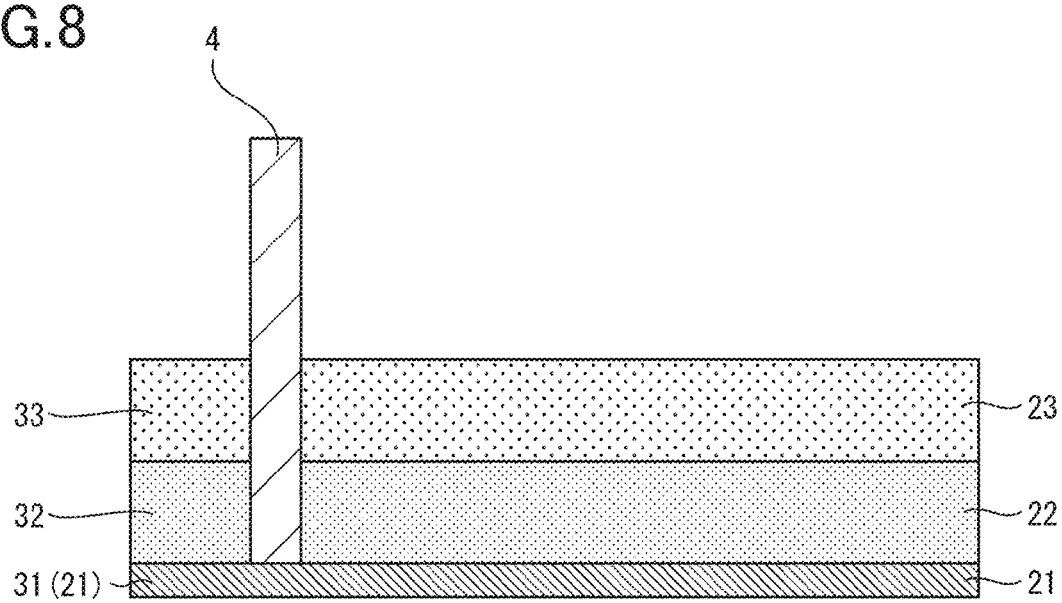
FIG. 8 is a diagram representing a process of manufacturing the light-emitting device shown in FIG. 1 (step 1).

The anode electrode 21 is formed on an array substrate (not shown) by a common electrode forming method such as vapor deposition or sputtering as shown in FIG. 8. The anode electrode 21 is preferably reflective to exploit the light output of the light-emitting diode 2, but may be transmissive.

Next, the partition wall 4 is formed that separates the light-emitting diode 2 and the protection diode 3. A hole transport layer doped with a high concentration of impurity is then formed in such a manner as to include the n$^+$ semiconductor layer 22 and the p$^+$ semiconductor layer 23 stacked in this order on the anode electrode 21.

The hole transport layer may be formed by sputtering or if nanoparticles are used, by applying a colloidal solution. Table 1 below shows possible combinations of materials, impurities, and impurity concentrations for the n$^+$ semiconductor layer 22 and the p$^+$ semiconductor layer 23.

TABLE 1

| | Base Material | | N-type Doping | | P-type Doping | |
|---|---|---|---|---|---|---|
| Material | (Isolated) Energy Level of Upper End of Valence Band [eV] | (Isolated) Energy Level of Lower End of Conduction Band [eV] | Element | Amount Added [cm$^{-3}$] | Element | Amount Added [cm$^{-3}$] |
| ZnS | −5.2 | −3.2 | Vacant Al, In, Ga, O | Not less than 1E19 | N, Li, F, Cl, I | Not less than 1E+21 |
| ZnSe | −5.5 | −2.7 | Vacant Al, In, Ga, O | Not less than 1E19 | N, Li, F, Cl, I | Not less than 1E+21 |
| CdS | −6.2 | −3.7 | Vacant Al, In, Ga, O | Not less than 1E19 | N, Li, F, Cl, I | Not less than 1E+21 |
| ZnO | −7.2 | −4 | Vacant Al, In, Ga, O | Not less than 1E19 | N, Li, F, Cl, I | Not less than 1E+21 |
| GaN | −3.2 | −6.7 | Si, O | Not less than 1E19 | Mg, Zn, Be | Not less than 1E+22 |
| AlN | −1.3 | −7.5 | Si, O | Not less than 1E19 | Mg, Zn, Be | Not less than 1E+22 |

Figure 9:
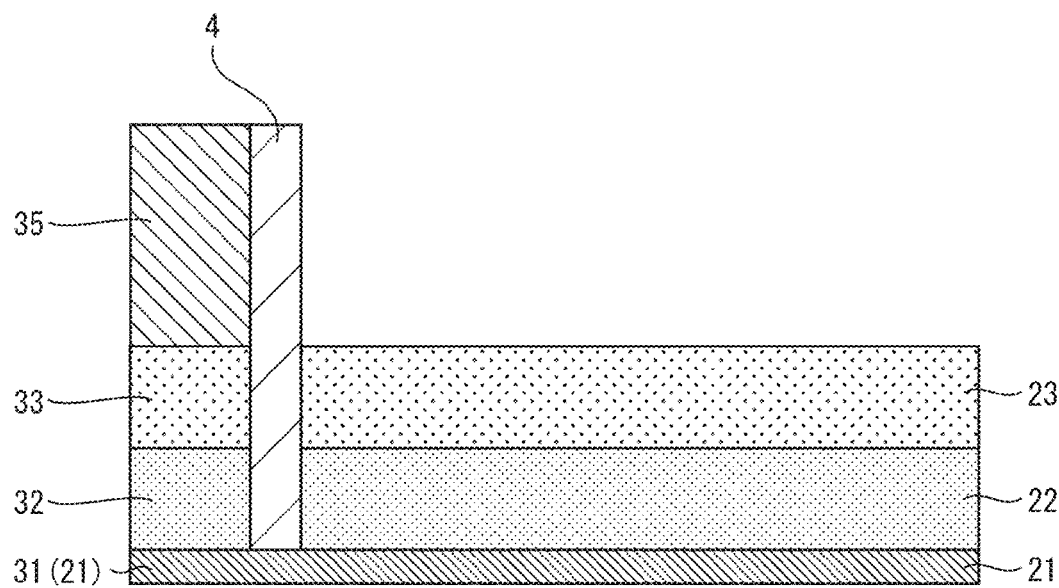
FIG. 9 is a diagram representing the process of manufacturing the light-emitting device shown in FIG. 1 (step 2).

Next, as shown in FIG. 9, a part of the face of the stack up to the p$^+$ semiconductor layer 23 (to the left of the partition wall 4 in FIG. 9) is covered with a resist or bank material (mask 35) by photolithography. This covered region will be a part of the protection diode 3 when the protection diode 3 is completely manufactured.

Figure 10:
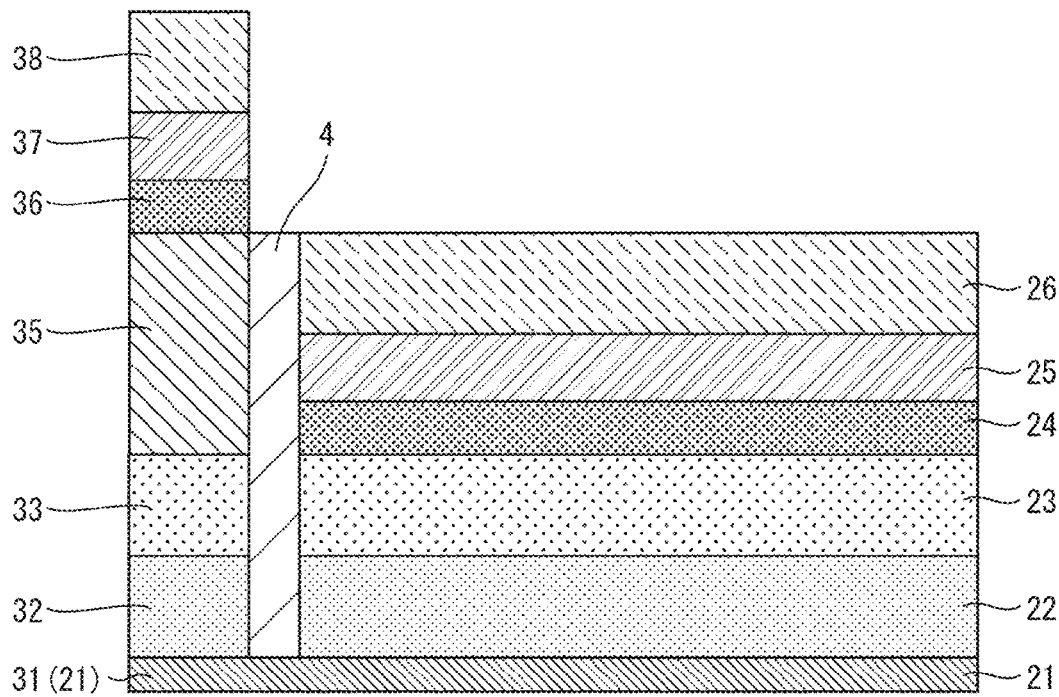
FIG. 10 is a diagram representing the process of manufacturing the light-emitting device shown in FIG. 1 (step 3).

Next, as shown in FIG. 10, the p-type semiconductor layer 24 (36), the light-emitting layer 25 (37), and the electron transport layer 26 (38) are stacked in this order by a common method. The light-emitting layer 25 is made of quantum dots in the present example of the invention and may be formed by applying a colloidal solution or inkjet printing in this example.

The electron transport layer 26 may be made of an inorganic or organic material used in known QLEDs or OLEDs such as ZnO, GZO, ZAO, IZO, IGZO, $TiO_2$, $WO_3$, or $MoO_3$. Table 2 below shows the electrical properties of ZnO-based materials.

TABLE 2

| Material | CBM [eV] | VBM [eV] | $E_g$ [eV] | $E_f$ [eV] | n [cm$^{-3}$] | μ [cm$^2$/V·sec] | ρ [Ω·cm] |
|---|---|---|---|---|---|---|---|
| IZO | −4.4 to −4.8 | −7.2 to −7.9 | 2.8 to 3.1 | Up to CBM | $10^{18}$ | 60 to 90 | $10^{-4}$ |
| GZO | −4.2 to −4.6 | −7.3 to −7.7 | 3.1 | Up to CBM | $10^{20}$ to $10^{21}$ | 16 to 25 | $2.8 \times 10^{-4}$ to $8 \times 10^{-4}$ |
| AZO | −4.1 to −4.4 | −7.6 to −8.2 | 3.5 to 3.8 | Up to CBM | $10^{19}$ to $10^{20}$ | 40 to 60 | $10^{-4}$ |
| ZnO | −4 | −7.2 | 3.2 | Up to CBM | $10^{18}$ to $10^{20}$ | 30 to 40 | $10^{-4}$ |

Figure 11:
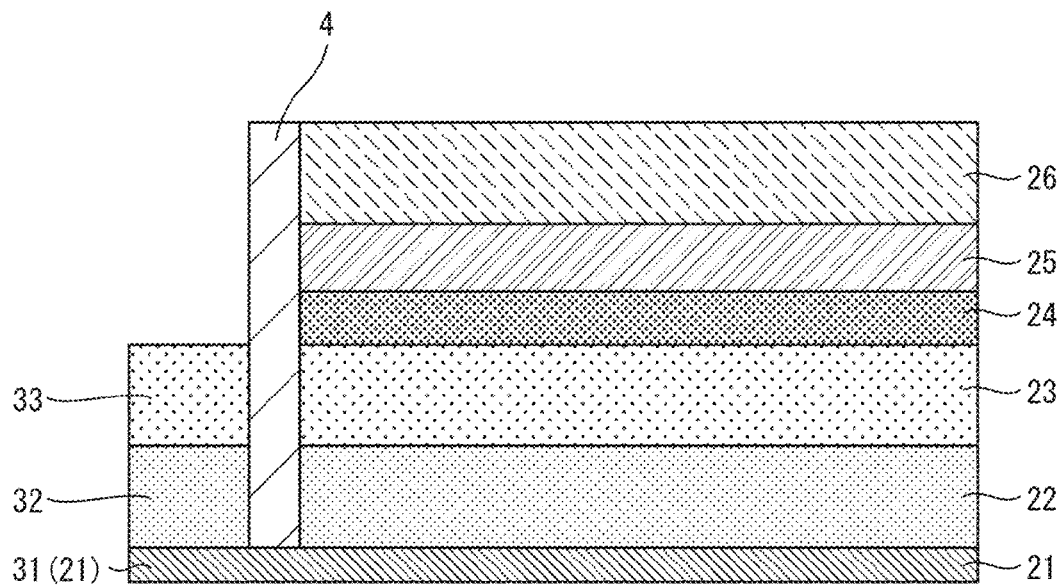
FIG. 11 is a diagram representing the process of manufacturing the light-emitting device shown in FIG. 1 (step 4).

Next, as shown in FIG. 11, the mask 35 is removed that covers the region destined to be the protection diode 3.

Figure 12:
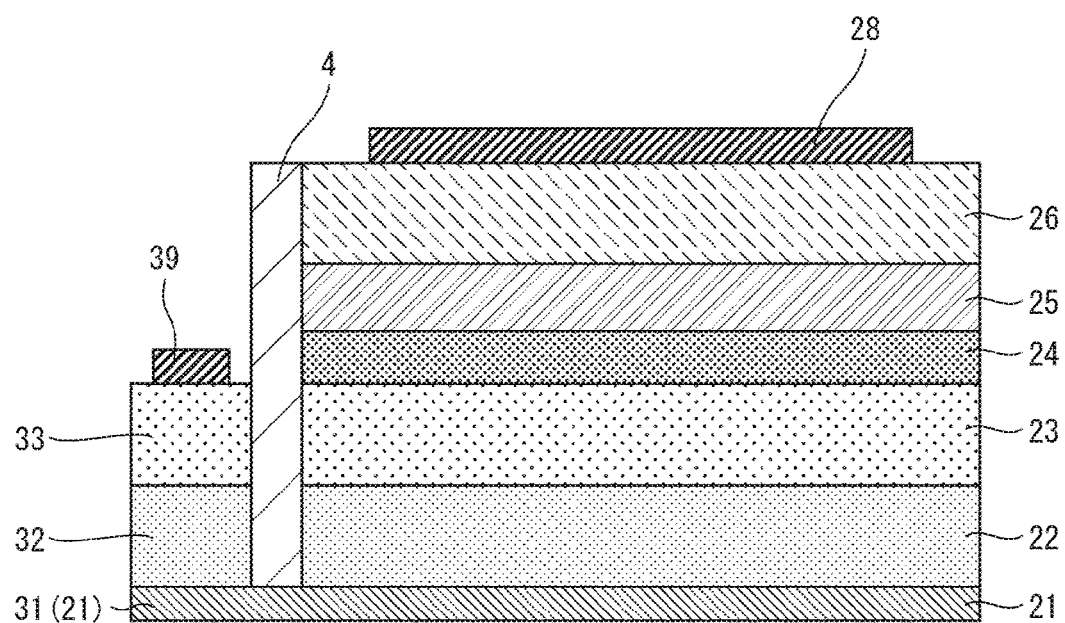
FIG. 12 is a diagram representing the process of manufacturing the light-emitting device shown in FIG. 1 (step 5).

Next, as shown in FIG. 12, a new mask 28 (39) is prepared that has an opening that matches the shape of the cathode electrode 27 (34) for the light-emitting diode 2 and the protection diode 3. The mask 28 (39) may be made of the same material and by the same method as the mask 35 shown in FIG. 9.

No mask is provided over a region where there will be formed an edge cover 40 (4) that separates the light-emitting diode 2 and the protection diode 3.

Figure 13:
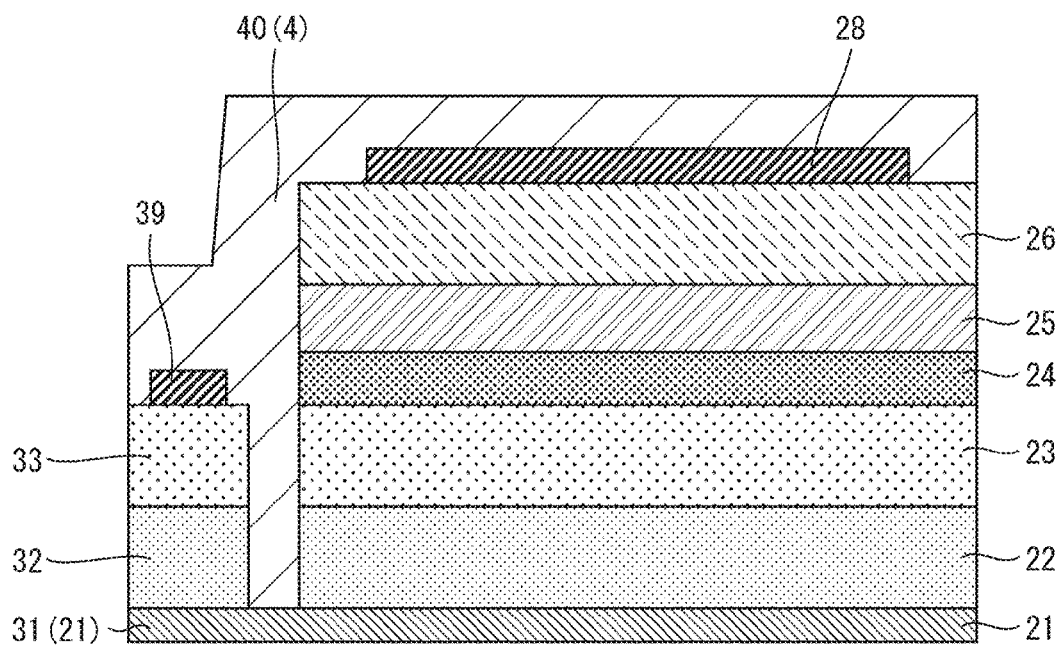
FIG. 13 is a diagram representing the process of manufacturing the light-emitting device shown in FIG. 1 (step 6).

Next, as shown in FIG. 13, an insulating material is applied or vapor deposited that will form the edge cover 40. The edge cover 40 may be made of the same insulating material as the partition wall 4.

Figure 14:
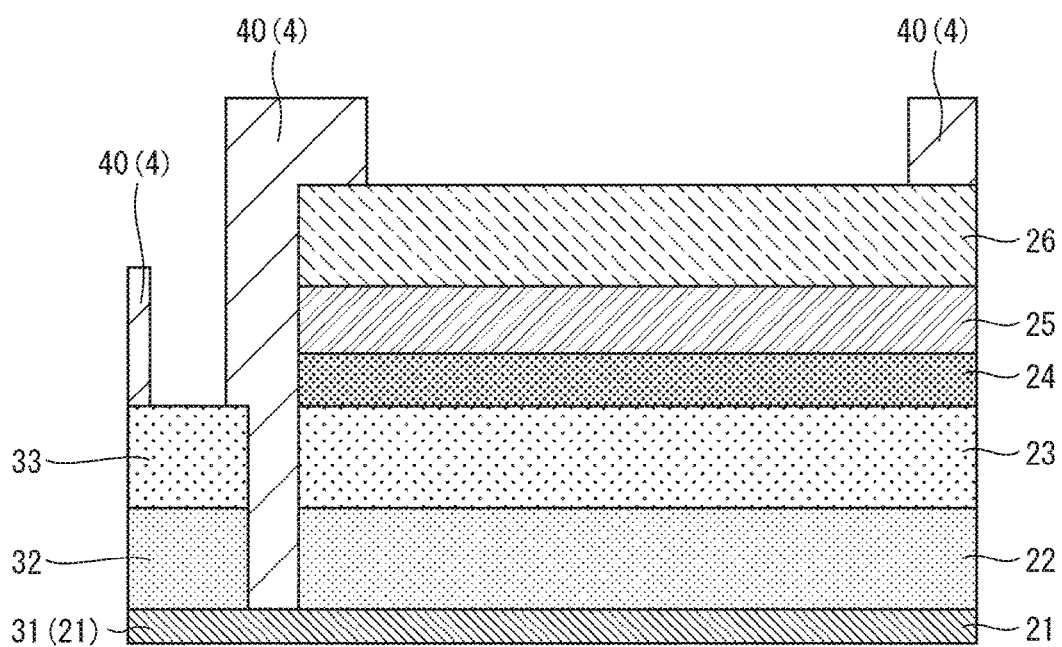
FIG. 14 is a diagram representing the process of manufacturing the light-emitting device shown in FIG. 1 (step 7).

Next, as shown in FIG. 14, the mask 28 (39) is lifted off or peeled, which leaves the edge cover 40 in the light-emitting diode 2 and the protection diode 3 behind.

Figure 15:
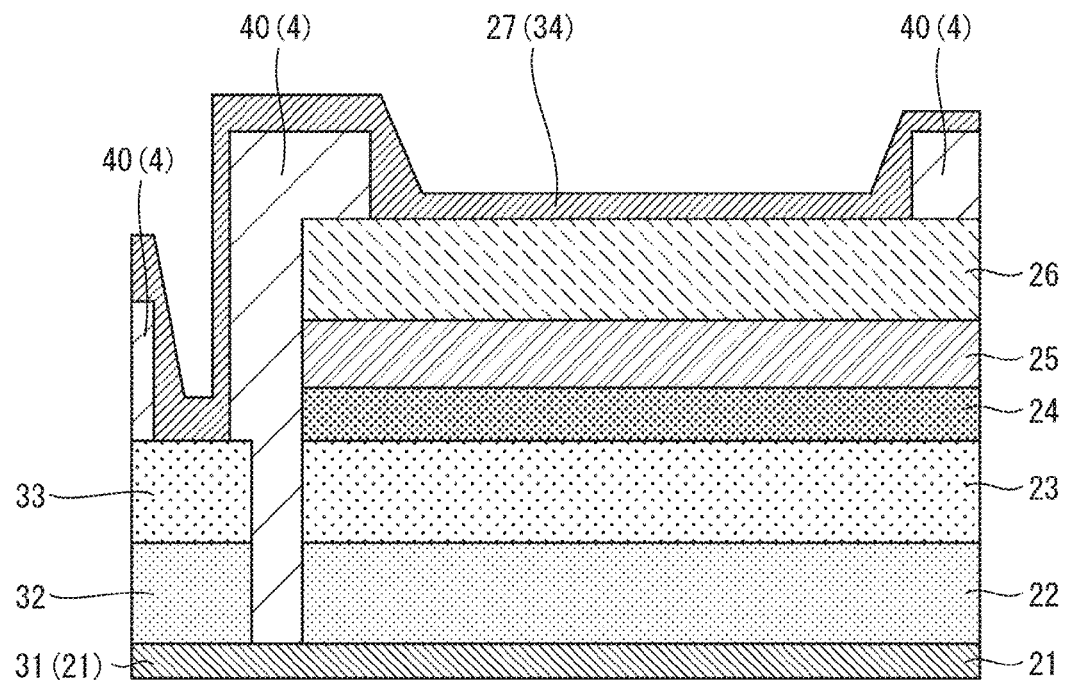
FIG. 15 is a diagram representing the process of manufacturing the light-emitting device shown in FIG. 1 (step 8).

Finally, as shown in FIG. 15, the cathode electrode 27 (34) is formed across the surface of the product in process shown in FIG. 14, which simultaneously completes the manufacture of the light-emitting diode 2 and the protection diode 3 adjacent to the light-emitting diode 2.

The light-emitting device 1 in accordance with the present embodiment can be manufactured in this manner. The light-emitting device 1 can achieve efficient discharging of electric charge because the electrical interface between the same material as at least a portion of the hole transport layer and the electrodes has a low contact resistance. The light-emitting device 1 also requires a fewer steps to manufacture because the steps of manufacturing the light-emitting diode 2 and the steps of manufacturing the protection diode 3 can be performed in parallel.

Location of Protection Diode

Figure 16:
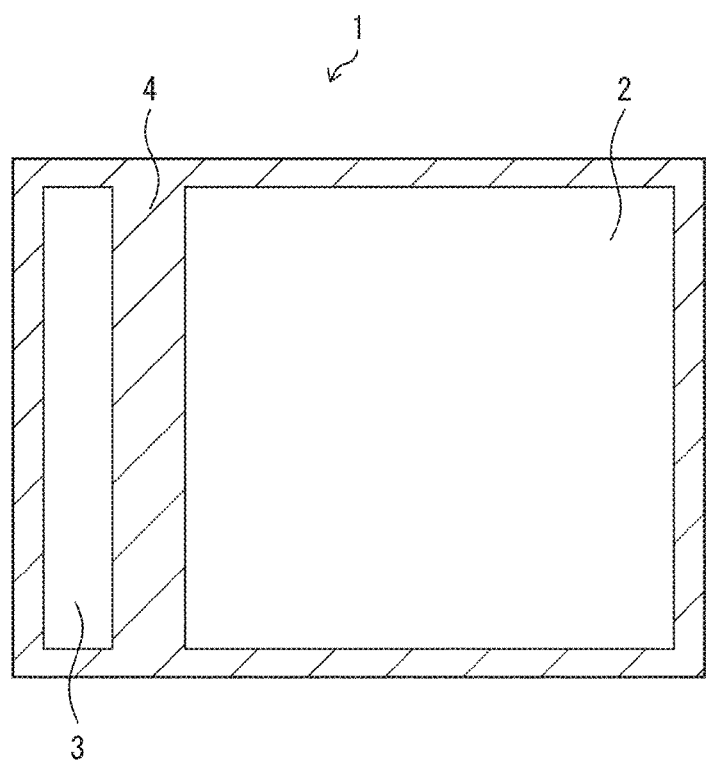
FIG. 16 is a schematic plan view of a structure of the light-emitting device shown in FIG. 15.
Figure 17:
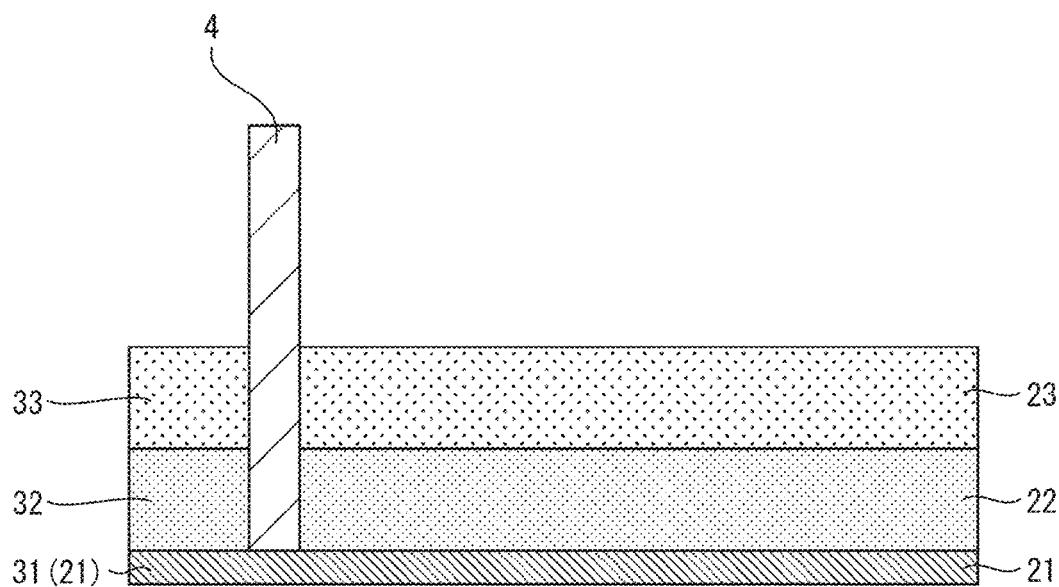
FIG. 17 is a diagram representing another process of manufacturing the light-emitting device shown in FIG. 1 (step 1).
Figure 18:
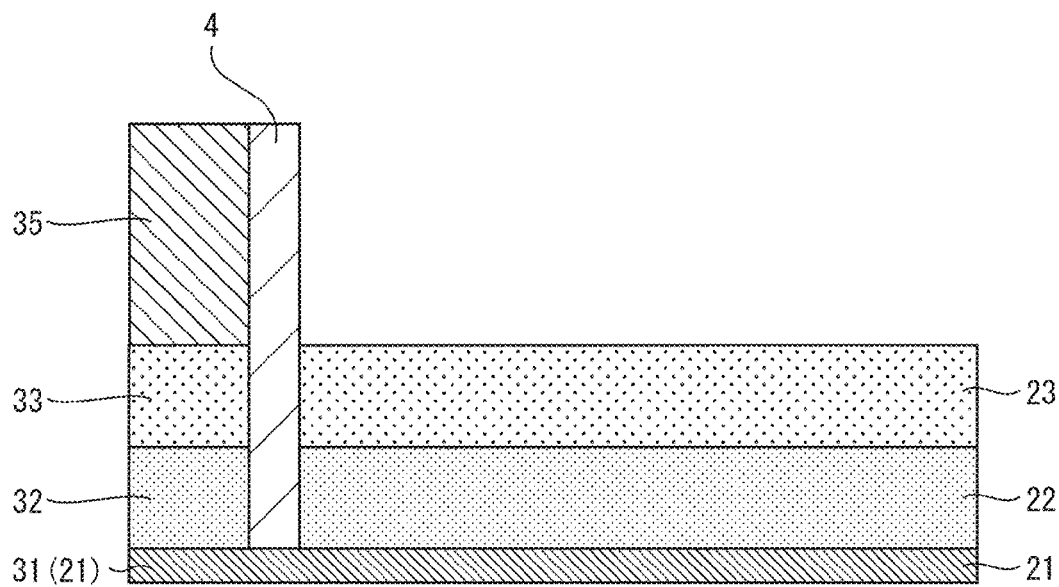
FIG. 18 is a diagram representing the other process of manufacturing the light-emitting device shown in FIG. 1 (step 2).
Figure 19:
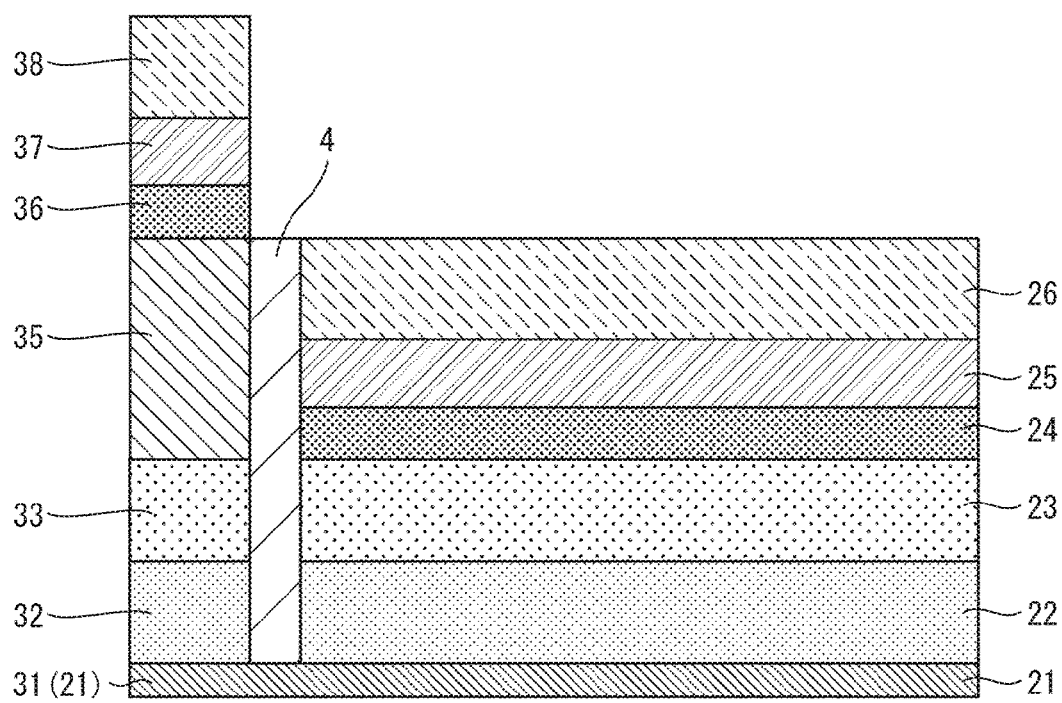
FIG. 19 is a diagram representing the other process of manufacturing the light-emitting device shown in FIG. 1 (step 3).
Figure 20:
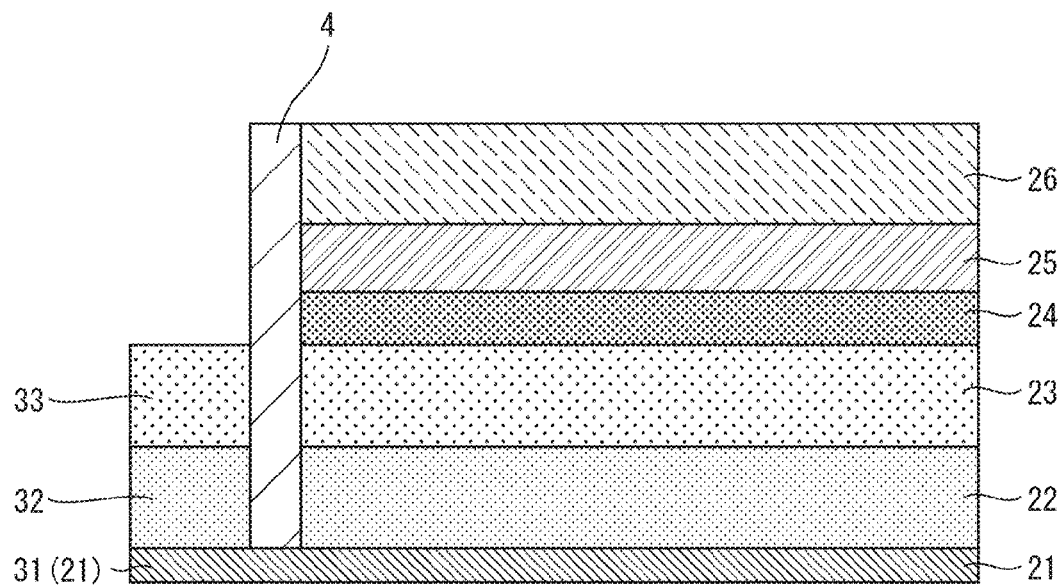
FIG. 20 is a diagram representing the other process of manufacturing the light-emitting device shown in FIG. 1 (step 4).

FIG. 16 is a schematic plan view of a structure of the light-emitting device 1. Referring to FIG. 16, the protection diode 3 may be located anywhere relative to the light-emitting diode 2 as these diodes are viewed on the plane of the paper. As another alternative, the protection diode 3 may be provided surrounding the light-emitting diode 2. The light-emitting device 1 preferably corresponds to a single pixel in a display device 100 (detailed later) in the present example of the invention. This particular structure facilitates the provision of the protection diode 3 on a pixel-by-pixel basis.

Example 3

Process of Manufacturing Light-Emitting Device

FIGS. 17 to 23 are diagrams representing a process of manufacturing a light-emitting device in accordance with the present example of the invention. The light-emitting device in accordance with the present example of the invention has the same structure as the light-emitting device in accordance with Example 2, except that the edge cover 40 is located on the top face of the integrated cathode electrode 27 (34) in the former.

The steps shown in FIGS. 17 to 20 are the same as the steps shown in FIGS. 8 to 11, and description thereof is therefore omitted.

Figure 21:
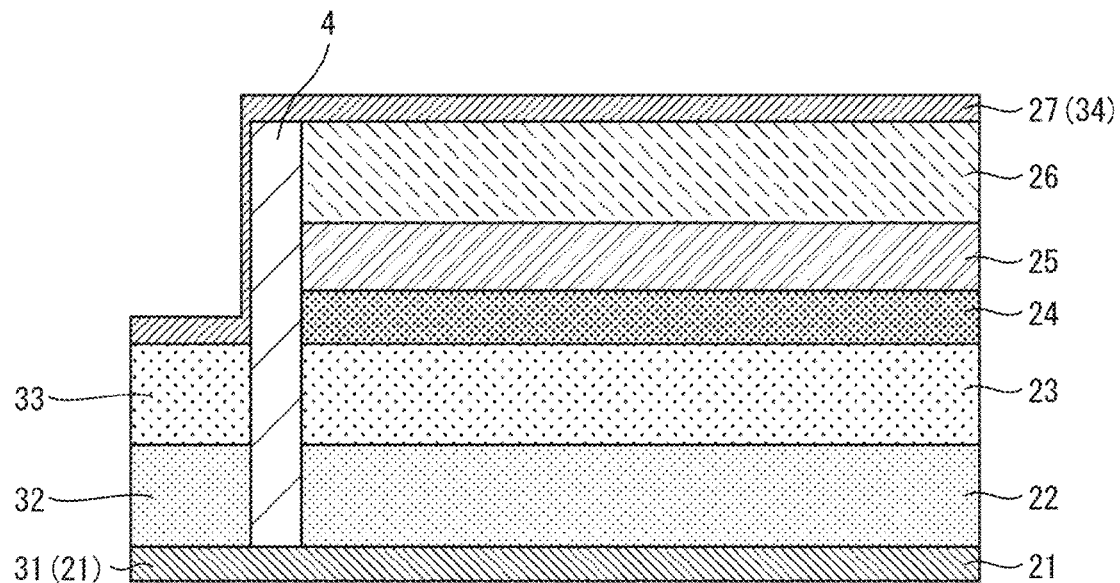
FIG. 21 is a diagram representing the other process of manufacturing the light-emitting device shown in FIG. 1 (step 5).

Next, as shown in FIG. 21, the mask 35 is remove. The cathode electrode 27 (34) is then formed across the surface. In this example, the top face of the protection diode 3 and the top face of the light-emitting diode 2 have a difference in height that is no more than a few tens of nanometers. The cathode electrode 27 (34) is therefore naturally formed so as to electrically connect the protection diode 3 and the light-emitting diode 2 without allowing for such a height difference that can lead to a disconnection.

Figure 22:
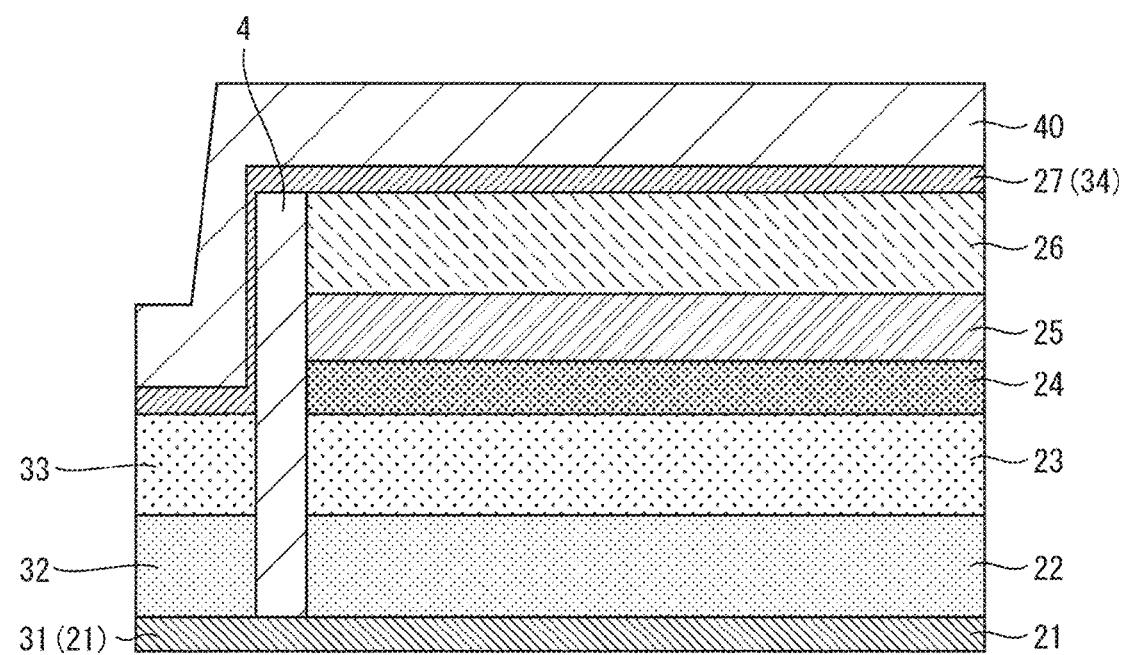
FIG. 22 is a diagram representing the other process of manufacturing the light-emitting device shown in FIG. 1 (step 6).
Figure 23:
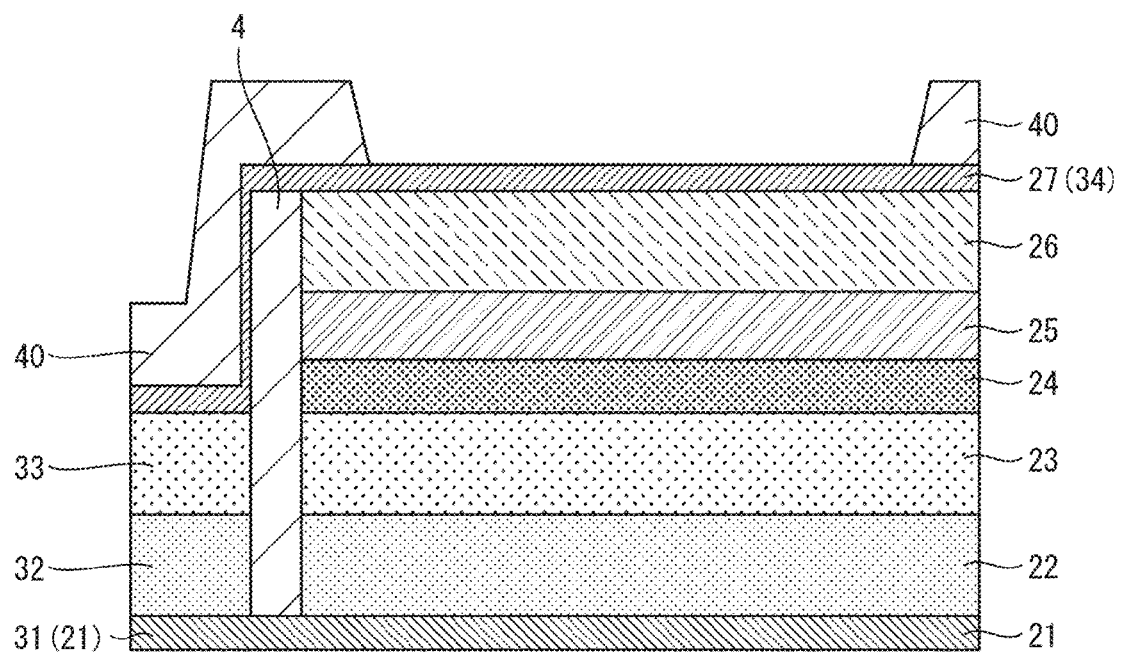
FIG. 23 is a diagram representing the other process of manufacturing the light-emitting device shown in FIG. 1 (step 7).

Next, as shown in FIGS. 22 and 23, a bank material for the edge cover 40 is applied. The bank material is subsequently removed from the light output face of the light-emitting diode 2 by common ashing, which completes the manufacture of the device structure.

An alternative to the present step is to form, on the cathode electrode 27 (34), a mask that only covers the light output region of the light-emitting diode 2, apply a bank material, and remove the mask by lift-off.

Equivalent Circuit of Light-Emitting Device

Figure 24:
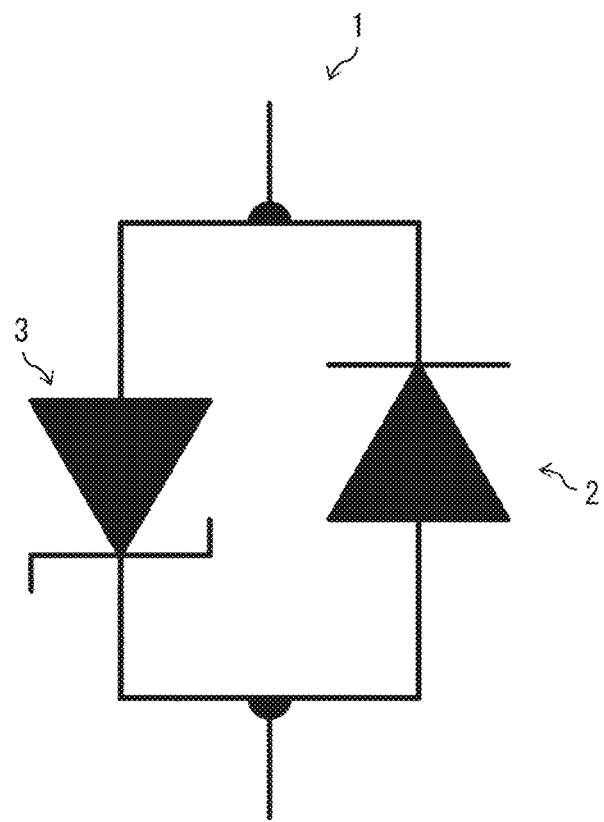
FIG. 24 is an equivalent circuit diagram for the light-emitting device shown in FIG. 1.

FIG. 24 is an equivalent circuit diagram for the light-emitting device 1. Referring to FIG. 24, the light-emitting device 1 is equivalent to a circuit in which the light-emitting diode 2 is connected in parallel with the protection diode 3. The power supply is connected to the light-emitting diode 2 and the protection diode 3 in such a manner that the light-emitting diode 2 is operated under forward bias and the protection diode 3 is operated under reverse bias. In this structure, the protection diode 3 does not conduct, therefore causing no leak current, when the light-emitting diode 2 is operated under normal driving conditions.

I-V Characteristics of Light-Emitting Device

Figure 25:
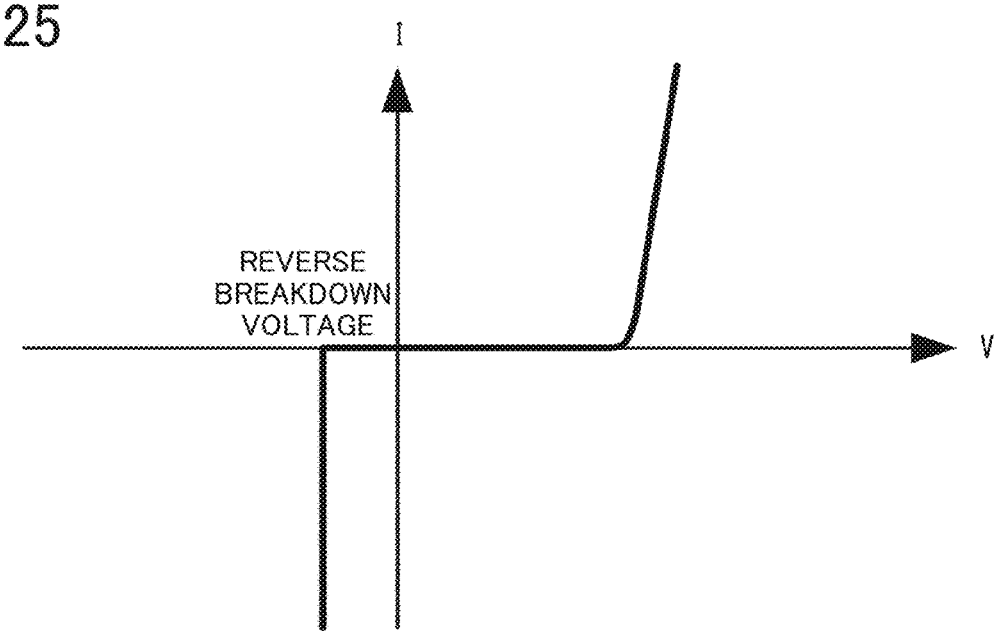
FIG. 25 is a diagram representing the I-V characteristics of the protection diode in the light-emitting device shown in FIG. 1.

FIG. 25 is a diagram representing the I-V characteristics of the protection diode 3 in the light-emitting device 1. Referring to FIG. 25, the protection diode 3 exhibits the same rectification characteristics as a common diode under forward bias, but has a reverse breakdown voltage that is as low as approximately 3 volts under reverse bias. The reverse breakdown voltage varies depending on the thickness of the p-n junction of the diode. The reverse breakdown voltage tends to decrease with a decrease in the thickness of the depletion layer of the junction. The p-type semiconductor layer and the n-type semiconductor layer need to be doped to a high concentration to allow for a thinned-down depletion layer.

The protection diode 3 allows a large electric current to flow therethrough once the applied voltage reaches the reverse breakdown voltage without requiring further increases in the voltage as shown in the I-V characteristics diagram. This large electric current discharges excess electric charge.

Example 4

Process of Manufacturing Light-Emitting Device

FIGS. 26 to 30 are diagrams representing a process of manufacturing a light-emitting device in accordance with the present example of the invention. The light-emitting device in accordance with the present example of the invention has the same structure as the light-emitting devices in accordance with the previous examples of the invention, except that the edge cover 40 is provided toward the anode electrode in the former.

Figure 26:
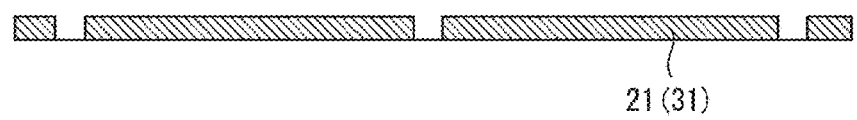
FIG. 26 is a diagram representing yet another process of manufacturing the light-emitting device shown in FIG. 1 (step 1).

The anode electrode 21 (31) (e.g., Ti) is formed on an array substrate (not shown) by a common electrode forming method such as vapor deposition or sputtering as shown in FIG. 26. The anode electrode 21 (31) is preferably reflective to exploit the light output of the light-emitting diode 2, but may be transmissive.

Figure 27:
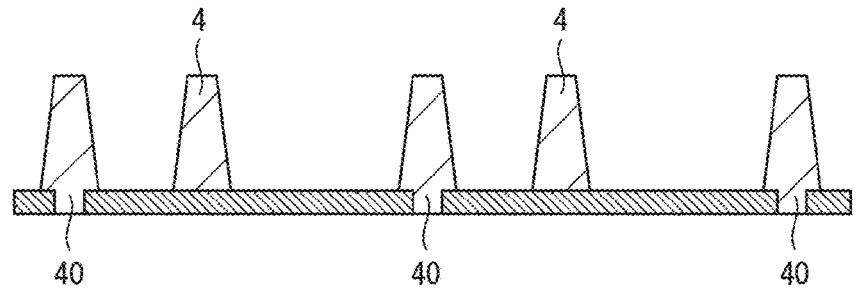
FIG. 27 is a diagram representing the yet other process of manufacturing the light-emitting device shown in FIG. 1 (step 2).

Next, the partition wall 4 and the edge cover 40 are formed. Specifically, as shown in FIG. 27, the partition wall 4, which separates the light-emitting diode 2 and the protection diode 3, and the edge cover 40 are formed by subjecting a polyimide material applied up to a thickness of 1 to 1.5 μm to such photolithography as to leave the partition wall 4 and the edge cover 40 behind.

Figure 28:
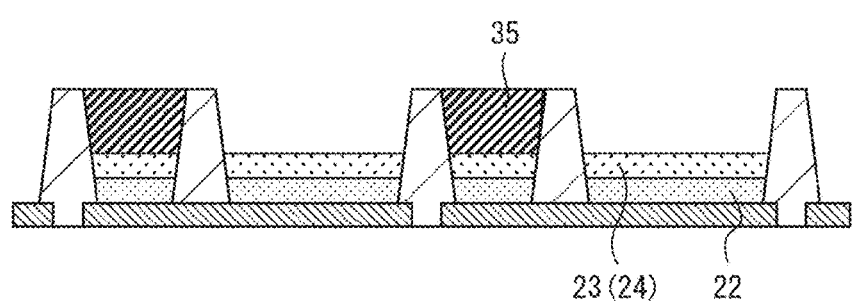
FIG. 28 is a diagram representing the yet other process of manufacturing the light-emitting device shown in FIG. 1 (step 3).

Next, a hole transport layer is formed, and a region where there will be the protection diode 3 is covered. Specifically, as shown in FIG. 28, a hole transport layer doped with a high concentration of impurity is formed in such a manner as to include the $n^+$ semiconductor layer 22, the $p^+$ semiconductor layer 23, and the p-type semiconductor layer 24 in this order on the anode electrode 21 (31).

The hole transport layer may be formed by sputtering or if nanoparticles are used, by applying a colloidal solution. Table 3 below shows possible combinations of materials, impurities, and impurity concentrations for the $n^+$ semiconductor layer 22 and the $p^+$ semiconductor layer 23.

TABLE 3

| | Base Material | | | | | |
|---|---|---|---|---|---|---|
| | (Isolated) Energy Level of Upper End | (Isolated) Energy Level of Lower End | N-type Doping | | P-type Doping | |
| Material | of Valence Band [eV] | of Conduction Band [eV] | Element | Amount Added [cm$^{-3}$] | Element | Amount Added [cm$^{-3}$] |
| ZnS | −5.2 | −3.2 | Vacant Al, In, Ga, O | Not less than 1E19 | N, Li, F, Cl, I | Not less than 1E+21 |
| ZnSe | −5.5 | −2.7 | Vacant Al, In, Ga, O | Not less than 1E19 | N, Li, F, Cl, I | Not less than 1E+21 |
| CdS | −6.2 | −3.7 | Vacant Al, In, Ga, O | Not less than 1E19 | N, Li, F, Cl, I | Not less than 1E+21 |
| ZnO | −7.2 | −4 | Vacant Al, In, Ga, O | Not less than 1E19 | N, Li, F, Cl, I | Not less than 1E+21 |
| GaN | −3.2 | −6.7 | Si, O | Not less than 1E19 | Mg, Zn, Be | Not less than 1E+22 |
| AlN | −1.3 | −7.5 | Si, O | Not less than 1E19 | Mg, Zn, Be | Not less than 1E+22 |

Next, a part of the face of the stack up to the $p^+$ semiconductor layer 23 (to the left of the partition wall 4 in FIG. 28) is covered with a resist or bank material (mask 35) by photolithography. This covered region will be the protection diode 3.

Figure 29:
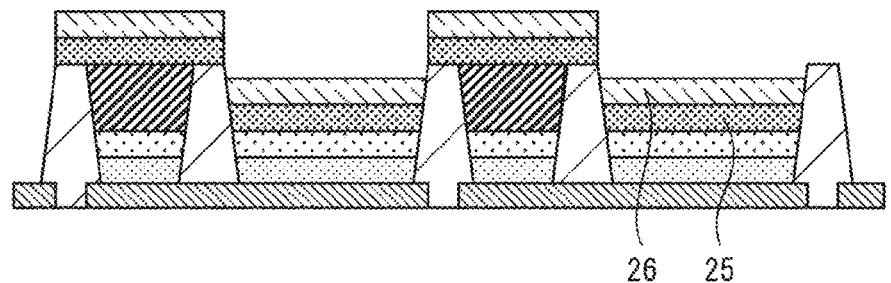
FIG. 29 is a diagram representing the yet other process of manufacturing the light-emitting device shown in FIG. 1 (step 4).

Next, the light-emitting layer 25 and the electron transport layer 26 are formed. Specifically, as shown in FIG. 29, the light-emitting layer 25 and the electron transport layer 26 are stacked in this order by a common method. The light-emitting layer 25 is made of quantum dots in the present example of the invention and may be formed by applying a colloidal solution or inkjet printing in this example.

The electron transport layer 26 may be made of an inorganic or organic material used in known QLEDs or OLEDs such as ZnO, GZO, ZAO, IZO, IGZO, TiO$_2$, WO$_3$, or MoO$_3$. Table 4 below shows the electrical properties of ZnO-based materials.

TABLE 4

| Material | CBM [eV] | VBM [eV] | $E_g$ [eV] | $E_f$ [eV] | n [cm$^{-3}$] | μ [cm$^2$/ V · sec] | ρ [Ω · cm] | Material |
|---|---|---|---|---|---|---|---|---|
| IZO | −4.4 to −4.8 | −7.2 to −7.9 | 2.8 to 3.1 | Up to CBM | $10^{18}$ | 60 to 90 | $10^{-4}$ | IZO |
| GZO | −4.2 to −4.6 | −7.3 to −7.7 | 3.1 | Up to CBM | $10^{20}$ to $10^{21}$ | 16 to 25 | $2.8 \times 10^{-4}$ to $8 \times 10^{-4}$ | GZO |
| AZO | −4.1 to −4.4 | −7.6 to −8.2 | 3.5 to 3.8 | Up to CBM | $10^{19}$ to $10^{20}$ | 40 to 60 | $10^{-4}$ | AZO |
| ZnO | −4 | −7.2 | 3.2 | Up to CBM | $10^{18}$ to $10^{20}$ | 30 to 40 | $10^{-4}$ | ZnO |

Figure 30:
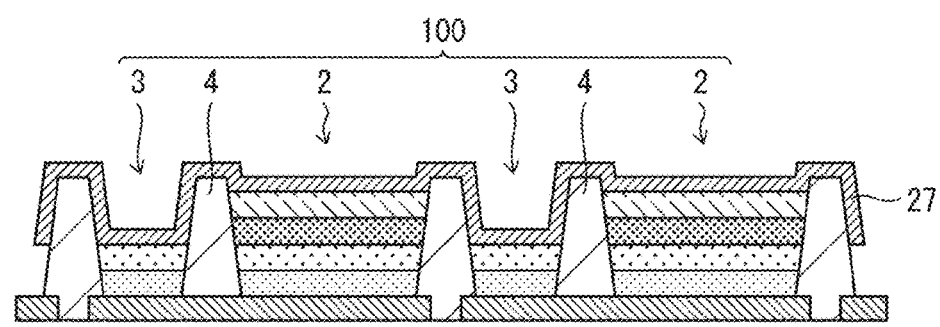
FIG. 30 is a diagram representing the yet other process of manufacturing the light-emitting device shown in FIG. 1 (step 5).

Next, the mask 35 is removed, and the cathode electrode 27 is formed. Specifically, as shown in FIG. 30, the mask 35 is removed that covers the region destined to be the protection diode 3. The cathode electrode 27 is formed across the surface of the product in process shown in FIG. 29, which simultaneously completes the manufacture of the light-emitting diode 2 and the protection diode 3 adjacent to the light-emitting diode 2.

Finally, the cathode electrode 27 of the light-emitting diode 2 and the protection diode 3 is connected to pixel wiring, which completes the manufacture of the display device 100.

As described here, the display device 100 includes a plurality of light-emitting devices 1. Each light-emitting device 1 includes a light-emitting diode 2 and a protection diode 3. The light-emitting device 1 includes: an insular, second anode electrode 21 (31) that is common to the light-emitting diode 2 and the protection diode 3; and a second cathode electrode 27 that is common to the plurality of light-emitting devices 1. The light-emitting diode 2 includes: a light-emitting layer 25 between the second anode electrode 21 (31) and the second cathode electrode 27; and a first hole transport layer 22 and a second hole transport layer 23 in this order between the second anode electrode 21 (31) and the light-emitting layer 25. The protection diode 3 includes a n-type semiconductor layer 32 and a p-type semiconductor layer 33 in this order between a first anode electrode 21 (31) and a first cathode electrode 27.

As an example, the protection diode 3 in accordance with the present embodiment is a Zener diode that is operated by taking advantage of the reverse breakdown thereof. The protection diode 3 therefore rapidly conducts once the applied voltage reaches the reverse breakdown voltage, which effectively protects the light-emitting diode 2 from excess voltage. The protection diode 3 in this condition automatically stops conducting once the applied voltage falls below the reverse breakdown voltage due to decreasing excess charge. This series of protection procedures is non-destructive and does not at all affect the operation of the light-emitting diode 2 and the protection diode 3. Hence, the protection diode 3 can repeatedly and effectively protect the light-emitting diode 2.

Example 5

As an alternative process of manufacturing the light-emitting device 1, for example, only either one of the protection diode 3 and the light-emitting diode 2 is first independently manufactured, a gap needed to separate the entire light-emitting device 1 and that diode is then covered with a resist or a metal mask, and the other diode is stacked thereon.

Following the completion of the manufacture of the light-emitting device, the mask covering one of the diodes is removed, and the cathode electrode of the light-emitting device is connected to pixel wiring, which completes the manufacture of the display device 100.

This method requires no common portion between the circuit for the protection diode 3 and the layered structure of the light-emitting diode 2 and for this reason, allows the protection diode 3 to be readily and inexpensively added to the known light-emitting diode 2 that is manufactured by a typical method.

Embodiment 2

Figure 31:
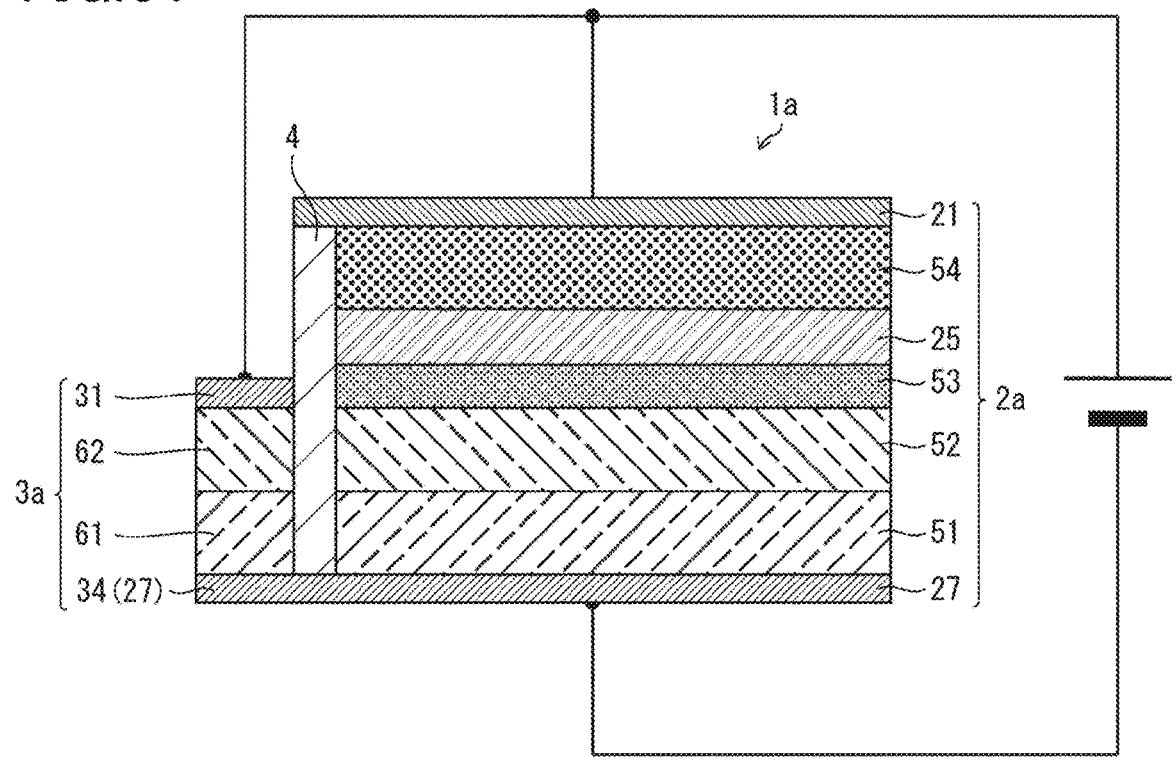
FIG. 31 is a schematic cross-sectional view of a light-emitting device in accordance with Embodiment 2 of the disclosure.

FIG. 31 is a schematic cross-sectional view of a light-emitting device 1a in accordance with the present embodiment. The light-emitting device 1a in accordance with the present embodiment has the same structure as the light-emitting device 1 in accordance with Embodiment 1, except that the hole transport layer and the electron transport layer are transposed in the former. A detailed description is given below.

A light-emitting diode 2a has a similar structure including a stack of layers. Each layer can be formed by sputtering a material doped with a desirable impurity or by applying a colloidal solution of such a material prepared in nanoparticle form.

Specifically, as shown in FIG. 31, the light-emitting diode 2a includes a cathode electrode 27, a first electron transport layer 51, a second electron transport layer 52, a third electron transport layer 53, a light-emitting layer 25, a hole transport layer 54, and an anode electrode 21 arranged in this order when viewed from the bottom layer toward the top layer in FIG. 31.

A protection diode 3a includes a cathode electrode 34 (integrated with the cathode electrode 27 of the light-emitting diode 2a), a first electron transport layer 61, a second electron transport layer 62, and a cathode electrode 31 (provided separately from the anode electrode 21 of the light-emitting diode 2a) arranged in this order when viewed from the bottom layer toward the top layer in FIG. 1.

A display device (not shown) in accordance with the present embodiment includes a plurality of light-emitting devices 1a in this manner. Each light-emitting device 1a includes the light-emitting diode 2a and the protection diode 3a. The light-emitting device 1a includes: an insular, third cathode electrode 27 (34) that is common to the light-emitting diode 2a and the protection diode 3a; and a third anode electrode 21 (31) that is common to the plurality of light-emitting devices 1a. The light-emitting diode 2a includes: the light-emitting layer 25 between the third cathode electrode 27 and the third anode electrode 21; and the first electron transport layer 51 and the second electron transport layer 52 in this order between the third cathode electrode 27 and the light-emitting layer 25. The protection diode 3a includes a p-type semiconductor layer 61 and a n-type semiconductor layer 62 in this order between a first cathode electrode 34 and a first anode electrode 31.

The electron transport layer and the hole transport layer in accordance with the present embodiment may be made of the same material as the electron transport layer and the hole transport layer in accordance with Embodiment 1 respectively. Detailed description is omitted.

The present embodiment can achieve the same advantages as Embodiment 1.

Layered Metal Oxide Structure of Protection Diode

The protection diodes 3 and 3a, in Embodiments 1 and 2 above, include a first metal oxide layer 32 and a second metal oxide layer 33 on the first metal oxide layer 32. The first metal oxide layer 32 may have a different oxygen concentration from the second metal oxide layer 33.

Specifically, the first metal oxide layer 32 is in contact with the first anode electrode 31 of the protection diodes 3 and 3a. The second metal oxide layer 33 is in contact with the first cathode electrode 34 of the protection diodes 3 and 3a. The second metal oxide layer 33 has a higher oxygen concentration than the first metal oxide layer 32.

If the metal oxide has properties like those of the semi-conductor, the metal oxide forms a n-type semiconductor layer when the metal oxide is oxygen deficient relative to its stoichiometric composition and a p-type semiconductor layer when the metal oxide is oxygen excessive relative to its stoichiometric composition. Therefore, a Zener diode may be prepared, for example, from metal oxides by connecting the oxygen-excessive, first metal oxide layer to the cathode electrode 34 of the protection diodes 3 and 3a and the oxygen-deficient, second metal oxide layer to the anode electrode 31 of the protection diodes 3 and 3a respectively.

In the formation of such a Zener diode, the p-n junction between the first metal oxide layer and the second metal oxide layer can be reduced in thickness by specifying the second metal oxide layer to have a higher oxygen concentration than the first metal oxide layer and the first metal oxide layer to have a lower oxygen concentration than the stoichiometric composition. These structure and specification enable suitable protection of the light-emitting devices 1 and 1a from excess voltage.

Exemplary Compositions of Semiconductor Layers of Protection Diode

Both the protection diodes 3 and 3a include a n-type semiconductor layer and a p-type semiconductor layer in Embodiments 1 and 2 described above. The following will describe exemplary compositions of the n-type semiconductor layer and the p-type semiconductor layer in detail.

Exemplary Composition 1

The protection diodes 3 and 3a include the n-type semiconductor layers 32 and 62 respectively that may contain a Group III-V compound doped with a Group IV or Group VI impurity.

Exemplary Composition 2

Alternatively, the protection diodes 3 and 3a include the n-type semiconductor layers 32 and 62 respectively that may contain a Group II-VI compound doped with a Group III impurity.

Exemplary Composition 3

As another alternative, the protection diodes 3 and 3a include the n-type semiconductor layers 32 and 62 respectively that may contain: a first Group IV compound doped with a Group III impurity; and a second Group IV compound that differs from the first Group IV compound.

Exemplary Composition 4

The protection diodes 3 and 3a include the p-type semiconductor layers 33 and 61 respectively that may contain a Group III-V compound doped with a Group II impurity.

Exemplary Composition 5

Alternatively, the protection diodes 3 and 3a include the p-type semiconductor layers 33 and 61 respectively that may contain a Group II-VI compound doped with either any one of Group II, Group V, Group VI, and Group VII impurities or a combination of any of these Group II, V, VI, and VII impurities.

Exemplary Composition 6

As another alternative, the protection diodes 3 and 3a include the p-type semiconductor layers 33 and 61 respectively that may contain: a third Group IV compound doped with a Group V impurity; and a fourth Group IV compound that differs from the third Group IV compound.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A light-emitting device comprising:
 a light-emitting diode including a light-emitting layer of quantum dots or an organic light-emitting material; and
 a protection diode located adjacent to, and connected in parallel with, the light-emitting diode, wherein
 the protection diode is operated in reverse bias to protect the light-emitting diode,
 the light-emitting diode includes an electrode and a hole transport layer,
 the protection diode includes another hole transport layer containing a same material as at least a portion of the hole transport layer, the portion being provided on the electrode, and
 the protection diode further includes an anode electrode in direct contact with a surface of the another hole transport layer, and a cathode electrode in direct contact with another surface of the another hole transport layer.

2. The light-emitting device according to claim 1, wherein the light-emitting device corresponds to a single pixel in a display device.

3. The light-emitting device according to claim 1, wherein the protection diode includes a n-type semiconductor layer containing a Group III-V compound doped with a Group IV or Group VI impurity.

4. The light-emitting device according to claim 1, wherein the protection diode includes a n-type semiconductor layer containing a Group II-VI compound doped with a Group III impurity.

5. The light-emitting device according to claim 1, wherein the protection diode includes a n-type semiconductor layer containing: a first Group IV compound doped with a Group III impurity; and a second Group IV compound that differs from the first Group IV compound.

6. The light-emitting device according to claim 1, wherein the protection diode includes a p-type semiconductor layer containing a Group III-V compound doped with a Group II impurity.

7. The light-emitting device according to claim 1, wherein the protection diode includes a p-type semiconductor layer containing a Group II-VI compound doped with either any one of Group II, Group V, Group VI, and Group VII impurities or a combination of any of these Group II, V, VI, and VII impurities.

8. The light-emitting device according to claim 1, wherein the protection diode includes a p-type semiconductor layer containing: a third Group IV compound doped with a Group V impurity; and a fourth Group IV compound that differs from the third Group IV compound.

9. A display device comprising:
 a plurality of light-emitting devices according to claim 1; and
 the anode electrode that is common to the plurality of light-emitting devices, wherein
 each of the plurality of light-emitting devices includes the cathode electrode that is common to the light-emitting diode, and the protection diode therein,
 the light-emitting diode includes:
  a light-emitting layer between the cathode electrode and the third-anode electrode; and
  a first electron transport layer and a second electron transport layer in this order between the cathode electrode and the light-emitting layer,
 the protection diode includes a p-type semiconductor layer and a n-type semiconductor layer in this order between the cathode electrode and the anode electrode,
 the first electron transport layer is made of a same material, and located in a same layer, as the p-type semiconductor layer, and
 the second electron transport layer is made of a same material, and located in a same layer, as the n-type semiconductor layer.

10. A light-emitting device, comprising:
 a light-emitting diode including a light-emitting layer of quantum dots or an organic light-emitting material; and a protection diode located adjacent to, and connected in parallel with, the light-emitting diode, wherein the protection diode is operated in reverse bias to protect the light-emitting diode, the light-emitting diode includes an electrode and a hole transport layer, the protection diode contains a same material as at least a portion of the hole transport layer, the portion being provided on the electrode, the protection diode includes a first metal oxide layer and a second metal oxide layer on the first metal oxide layer, and the first metal oxide layer and the second metal oxide layer have different oxygen concentrations.

11. The light-emitting device according to claim 10, wherein the first metal oxide layer is in contact with an anode electrode of the protection diode, the second metal oxide layer is in contact with a cathode electrode of the protection diode, and the second metal oxide layer has a higher oxygen concentration than does the first metal oxide layer.

12. A display device comprising:

a plurality of light-emitting devices each including:

a light-emitting diode including a light-emitting layer of quantum dots or an organic light-emitting material; and a protection diode located adjacent to, and connected in parallel with, the light-emitting diode, wherein the protection diode is operated in reverse bias to protect the light-emitting diode, the light-emitting diode includes an electrode and a hole transport layer, and the protection diode contains a same material as at least a portion of the hole transport layer, the portion being provided on the electrode, a cathode electrode that is common to the plurality of light-emitting devices, wherein each of the plurality of light-emitting devices includes an insular, an anode electrode that is common to the light-emitting diode and the protection diode therein, the light-emitting diode includes:

a light-emitting layer between the anode electrode and the second cathode electrode; and a first hole transport layer and a second hole transport layer in this order between the anode electrode and the light-emitting layer, the protection diode includes a n-type semiconductor layer and a p-type semiconductor layer in this order between the anode electrode and the cathode electrode, the first hole transport layer is made of a same material, and located in a same layer, as the n-type semiconductor layer, and the second hole transport layer is made of a same material, and located in a same layer, as the p-type semiconductor layer.

* * * * *